(12) United States Patent
Schwenter et al.

(10) Patent No.: US 11,835,375 B2
(45) Date of Patent: Dec. 5, 2023

(54) FIELD DEVICE OF PROCESS MEASUREMENT TECHNOLOGY, MEASURING SENSOR AND METHOD FOR PRODUCING A COIL APPARATUS

(71) Applicant: Endress+Hauser Flowtec AG, Reinach (CH)

(72) Inventors: Benjamin Schwenter, Breitenbac (CH); Martin Stucki, Pratteln (CH); Claude Hollinger, Aesch (CH); Marc Werner, Grenzach-Wyhlen (DE)

(73) Assignee: Endress+Hauser Flowtec AG, Reinach (CH)

( * ) Notice: Subject to any disclaimer, the term of this patent is extended or adjusted under 35 U.S.C. 154(b) by 130 days.

(21) Appl. No.: 17/438,490

(22) PCT Filed: Feb. 14, 2020

(86) PCT No.: PCT/EP2020/053905
§ 371 (c)(1),
(2) Date: Sep. 13, 2021

(87) PCT Pub. No.: WO2020/182409
PCT Pub. Date: Sep. 17, 2020

(65) Prior Publication Data
US 2022/0146294 A1    May 12, 2022

(30) Foreign Application Priority Data

Mar. 12, 2019 (DE) .................. 10 2019 106 244.6

(51) Int. Cl.
*G01F 1/84* (2006.01)
*H01F 5/00* (2006.01)
(Continued)

(52) U.S. Cl.
CPC .......... *G01F 1/8422* (2013.01); *G01F 1/8427* (2013.01); *H01F 5/003* (2013.01); *H05K 1/117* (2013.01); *H05K 3/403* (2013.01)

(58) Field of Classification Search
CPC ........................ G01F 1/8422; G01F 1/8427
(Continued)

(56) References Cited

U.S. PATENT DOCUMENTS 3,557,300 A    1/1971  Werner
4,524,038 A *  6/1985  Heinemann ............ H05K 3/321
                                                       29/854
(Continued)

FOREIGN PATENT DOCUMENTS

CN    201112571 Y       9/2008
DE    102015120087 A1   5/2017
(Continued)

OTHER PUBLICATIONS

Battery Booster Shield, Wayne and Layne, https://web.archive.org/web/20160604141835/https://www.wayneandlayne.com/projects/battery-booster-shield/, Nov. 27, 2019, 5 pp.

*Primary Examiner* — John Fitzgerald
*Assistant Examiner* — Rodney T Frank
(74) *Attorney, Agent, or Firm* — Mark A. Logan; Endress+Hauser (USA) Holding, Inc.

(57) ABSTRACT

Disclosed is a measuring sensor of a measuring device for detecting a mass flow rate. The measuring sensor comprises a measuring tube, a vibration exciter, and at least two vibration sensors. The vibration exciter and the vibration sensors each have a coil apparatus having at least one coil and at least one magnetic apparatus. The coil apparatus comprises a printed circuit board having at least one printed circuit board layer, wherein the coil is formed by means of an electrically conductive conductor track, wherein the coil
(Continued)

is arranged on the first side and/or second side of a printed circuit board layer, wherein the printed circuit board comprises at least two contact-making elements for connecting the coil to an electronic measuring and/or operating circuit of the measuring device by means of connection elements, and is characterized in that at least one contact-making element has a hole.

14 Claims, 4 Drawing Sheets

(51) Int. Cl.
*H05K 1/11* (2006.01)
*H05K 3/40* (2006.01)

(58) Field of Classification Search
USPC .................................................. 73/861.357
See application file for complete search history.

(56) References Cited

U.S. PATENT DOCUMENTS

| | | | |
|---|---|---|---|
| 5,992,725 | A | 11/1999 | Egawa et al. |
| 8,110,753 | B2 | 2/2012 | Chen et al. |

FOREIGN PATENT DOCUMENTS

| | | | |
|---|---|---|---|
| GB | 1117719 | A | 6/1968 |
| JP | 620731 | A | 1/1994 |

\* cited by examiner

FIELD DEVICE OF PROCESS MEASUREMENT TECHNOLOGY, MEASURING SENSOR AND METHOD FOR PRODUCING A COIL APPARATUS

CROSS-REFERENCE TO RELATED APPLICATIONS

The present application is related to and claims the priority benefit of German Patent Application No. 10 2019 106 244.6, filed on Mar. 12, 2019, and International Patent Application No. PCT/EP2020/053905, filed on Feb. 14, 2020, the entire contents of which are incorporated herein by reference.

TECHNICAL FIELD

The invention relates to a field device in process measurement technology, to a printed circuit board coil and to a method for contacting a printed circuit board coil.

BACKGROUND

Process measurement technology field devices with a sensor of the vibration type and especially Coriolis flow meters have been known for many years. The basic structure of such a measuring device is described, for example, in EP 1 807 681 A1, wherein reference is made in full to this publication with respect to the structure of a generic field device within the scope of the present invention.

Typically, Coriolis flow meters have at least one or more vibratable measuring tubes which can be set into vibration by means of a vibration exciter. These vibrations pass along the tube length and are varied by the type of flowable medium located in the measuring tube and its flow speed. At another point in the measuring tube, a vibration sensor or, in particular, two vibration sensors spaced apart from each other can record the varied vibrations in the form of a measurement signal or a plurality of measurement signals. An evaluation unit can then determine the flow rate and/or the density of the medium from the measuring signal(s).

Corresponding vibration exciters and/or vibration sensors are usually based on an electrodynamic principle and are usually constructed in several parts and comprise a magnetic apparatus for generating a magnetic field and a coil penetrated by said magnetic field. This coil usually consists of wire and is wound onto a bobbin, typically a cylindrical bobbin. This technology has essentially proven itself.

However, there are applications, e.g. applications at medium temperatures of more than 250° C., in which a Coriolis flow meter is used, which place particularly high requirements on the vibration sensor and the vibration exciter structure and where a high winding density of the coils is required with good insulation of the conductor tracks from one another.

DE 10 2015 120 087 A1 discloses a measuring device having a coil apparatus comprising a printed circuit board consisting of low-temperature co-fired ceramic, and a printed circuit board coil. The circuit board coil has two contact-making elements provided for connecting connection elements. The connection is carried out by a welding process. A disadvantage of this contact-making method is that the forces occurring during the mounting of the coil apparatus on the measuring device lead to the connection wire detaching from the contact-making element.

SUMMARY

The invention is based on the object of providing a field device, a measuring sensor and a method for manufacturing a coil apparatus so that the risk of the connection element detaching from the contact-making element is minimized.

A measuring sensor according to the invention of a measuring device for detecting a mass flow rate, a viscosity, a density and/or a variable derived therefrom of a medium flowing through at least one measuring tube of the measuring sensor comprises the at least one measuring tube having an inlet and an outlet, which is configured to conduct the medium between the inlet and the outlet, at least one vibration exciter which is configured to excite the at least one measuring tube to vibrations and at least two vibration sensors, which are configured to detect the excursion of the vibrations of at least one measuring tube, wherein at least one vibration exciter and the vibration sensors each have a coil apparatus having at least one coil in each case, and in each case comprise a magnetic apparatus, wherein the magnetic apparatus and the coil apparatus are movable relative to one another, wherein the magnetic apparatus and the coil apparatus of an vibration exciter or vibration sensor are configured to interact with one another by means of magnetic fields, wherein the coil apparatus comprises a printed circuit board having at least one printed circuit board layer, wherein each printed circuit board layer has a first side and a second side plane-parallel to the first face, wherein the coil is configured to detect or generate a time-varying magnetic field, wherein the coil is formed at least in portions by means of an electrically conductive conductor track, wherein the coil is arranged on the first side and/or second side of a printed circuit board layer, wherein the printed circuit board comprises at least two contact-making elements for connecting the coil to an electronic measuring and/or operating circuit of the measuring device by means of connection elements and is characterized in that at least one contact-making element has a hole.

According to one embodiment, a connection element is guided through the hole so that the first connection element is connected to the printed circuit board at least at one end in a positive-locking manner.

By means of the positive-locking connection of the connection element at one end to the printed circuit board, not only is an adequate mechanical fastening implemented but also an electrical contact to the printed circuit board coil.

According to one embodiment, one end of the first connection element is curved, bent or hook-shaped at least in sections, wherein the end is guided through the hole or at least inserted therein.

If the end of the connection element is curved or bent, tensile forces whose direction points substantially parallel to the surface plane of the printed circuit board will be transmitted to the printed circuit board. If the end of the connection element is hook-shaped and inserted into the hole in such a way that a retraction or withdrawal of the connection element without deformation thereof makes this impossible, tensile forces, the direction of which points substantially perpendicularly to the surface plane of the printed circuit board, will also be transmitted to the printed circuit board and a detachment of the electrical contact is avoided.

According to one embodiment, the connection element comprises a connection wire which comprises at least one metal from the following list: silver, gold, copper, platinum, tantalum, palladium.

According to one embodiment, the printed circuit board has at least one indentation with a bottom, wherein in each case a contact-making element is arranged on the bottom of one indentation, wherein the connection element is arranged in the indentation, wherein the indentation is at least partially filled with a solid metal micro-particle compound which integrally connects the connection element to the printed circuit board and the contact-making element and mediates an electrical contact between the connection element and the contact-making element.

According to one embodiment, the metal micro-particle mass comprises micro-particles of at least one metal from the following list: silver, gold, copper, platinum, tantalum, palladium.

According to one embodiment, the hole takes the form of a through-hole and passes through the contact-making element and the printed circuit board.

In one embodiment, the printed circuit board comprises a plurality of printed circuit board layers which are stacked and connected via their faces to adjacent printed circuit board layers.

In one embodiment, the contact-making elements are arranged either on at least one first side or on at least one second side. All contact-making elements are thus visible from a top view.

In one embodiment, the contact-making elements are arranged symmetrically with respect to the sectional plane.

In one embodiment, the printed circuit board has a number A_Total printed circuit board layers, wherein A_Total is greater than 1, wherein the printed circuit board comprises at least one indentation, which indentation is formed by at least one notch in an associated contiguous group of printed circuit board layers, wherein a number of the printed circuit board layers belonging to the associated group is less than A_Total, wherein a contact-making element belonging to an indentation is arranged on a contact-making circuit board layer, which contact-making circuit board layer adjoins the one corresponding group, wherein the contact-making element at least partially forms a bottom of the indentation, wherein the circuit board carrying the contact-making element is not covered by an adjacent printed circuit board, at least in the region of the contact-making element. For example, the indentation can be at least partially filled by means of an electrically conductive mass, which is configured to hold an electrical line on the contact-making element and to improve an electrical contact between the electrical line and the contact-making element.

In one embodiment, a plurality of printed circuit board layers each have a coil with in each case a first coil end and a second coil end, wherein the coils are connected in series and/or in parallel to one another, wherein the coils of different printed circuit board layers generate constructively interfering magnetic fields when an electrical voltage is applied between the first through-contact and the second through-contact.

By interconnecting a plurality of coils, a sensitivity of the coil apparatus to a magnetic field change in the region of the coil apparatus can be increased, and stronger magnetic fields can also be generated.

In one embodiment, the first coil ends are connected by means of a first through-contact, and wherein the second coil ends are connected by means of a second through-contact.

In one embodiment, adjacent coils are connected in each case by means of one of their coil ends, wherein one end of outer coils is connected in each case to a contact-making element.

In one embodiment, a difference in a DC electrical voltage resistance of the coil apparatuses of different vibration sensors is less than 3% and in particular less than 2% and preferably less than 1% of a mean value of the DC electrical voltage resistances of the coil apparatuses.

A method according to the invention for producing a coil apparatus according to any one of the preceding claims, comprises the following method steps:
introducing a hole into one of the contact-making elements, in particular a through-hole into one of the contact-making elements and the printed circuit board;
inserting the connection element into the hole;
partially enclosing the connection element and the contact-making elements with a metal micro-particle paste; and
drying, curing and/or sintering the metal micro-particle paste to form a metal micro-particle mass.

A suitable metal micro-particle paste can be obtained, for example, from Heraeus Germany GmbH Co. KG. For example, the silver paste with the designation ASP 131-06 can be used to implement the invention.

It is particularly advantageous if the connection element comprises a connection wire which has a flexibility. In this case, in a first step, the wire can be inserted into the hole and then be formed into the shape of a curve, bend or hook.

According to one embodiment, the printed circuit board has an indentation in which the contact-making element is arranged, wherein the enclosing of the connection element and the contact-making elements takes place by filling the indentation with the metal micro-particle paste.

For example, the indentation can be at least partially filled by means of an electrically conductive mass, which is configured to hold an electrical line on the contact-making element and to improve an electrical contact between the electrical line and the contact-making element.

According to one embodiment, the drying comprises heating the metal micro-particle paste to a drying temperature of at least 150° C., and in particular at least 180° C., and preferably at least 210° C.

According to one embodiment, the drying comprises maintaining the drying temperature for at least 20 minutes, and in particular at least 35 minutes, and preferably at least 50 minutes.

According to one embodiment, an adjustment of temperature from room temperature to drying temperature and/or from drying temperature to room temperature comprises a time period of at least 20 minutes, and in particular at least 35 minutes, and preferably at least 50 minutes.

According to one embodiment, particles of the metal micro-particle paste have a maximum extent of less than 50 micrometers, and in particular less than 35 micrometers, and preferably less than 20 micrometers.

The smaller a maximum expansion of the particles, the greater a ratio of a particle surface to a particle volume will be, so that contact forces between individual particles become increasingly dominant and give the metal micro-particle paste a sufficient strength.

According to one embodiment, the printed circuit board has, in an edge surface, at least one indentation with a bottom and a border, wherein the border in the region of the metal micro-particle mass has, at least in portions, unevennesses, for example in the form of a corrugation or a gradation, which unevennesses are designed to hold the metal micro-particle mass.

The unevennesses perpendicular to the border preferably have a height greater than half of a maximum extent of the particles. After completion of the drying process, the metal micro-particle mass thereby engages in the unevennesses and is thereby held firmly.

According to one embodiment, the drying of the metal micro-particle paste takes place in a high-pressure atmosphere of at least 3 bar, and preferably at least 5 bar, and in particular at least 10 bar.

According to one embodiment, the hole is formed by a punching method or a laser method.

According to one embodiment, pre-structured printed circuit board layers, in particular ceramic foils, are stacked and sintered to form the printed circuit board, wherein the hole is introduced into the contact-making element before or after sintering.

A field device according to the invention of process measurement technology comprises a measuring sensor according to the invention and an electronic measuring and/or operating circuit, wherein the electronic measuring and/or operating circuit is configured to operate the vibration sensors and the vibration exciter and is connected thereto by means of electrical connections, wherein the at least one electrical connection is routed to the electronic measuring and/or operating circuit, wherein the electronic measuring and/or operating circuit is further configured to determine and provide measured flow values and/or measured density values, wherein the field device has in particular an electronics housing for accommodating the electronic measuring and/or operating circuit.

BRIEF DESCRIPTION OF THE DRAWINGS

The invention is explained in greater detail with reference to the following figures. The following are shown.

DETAILED DESCRIPTION

The measuring principle of a Coriolis flow meter is briefly discussed below by means of a two-tube Coriolis flow meter (see FIG. 1). However, single-tube or 4-tube Coriolis flow meters, which are also included within the scope of the present invention, are also known. The measuring principle is based on the controlled generation of Coriolis forces. These forces occur in a system whenever translational (linear) and rotational (rotating) movements simultaneously overlap. The magnitude of the Coriolis force depends on the moving mass, its speed in the system, and thus on the mass flow. Instead of a constant rotational speed, a vibration occurs in the measuring sensor. In the case of the measuring sensor, two parallel measuring tubes through which the medium flows are brought into oscillation in antiphase and form a type of tuning fork. The Coriolis forces generated on the measuring tubes cause a phase shift of the tube vibration. At zero flow, i.e., when the medium is at a standstill, the two measuring tubes vibrate in phase. In the case of mass flow, the tube vibration is delayed at the inlet end and accelerated at the outlet end. The greater the mass flow, the greater the phase difference of the two vibrating measuring tubes. The tube vibration is tapped on the inlet and outlet ends by means of electrodynamic vibration sensors. The system balance is achieved by the mutual vibrations of the two measuring tubes. The measuring principle basically operates independently of temperature, pressure, viscosity, conductivity and flow profile. In addition to the mass flow rate, a density measurement of the measuring medium is also possible. In this case, the measuring tube is excited at its resonance frequency. As soon as the mass and thus the density of the oscillating system, i.e. the measuring tube and the medium, changes, the exciter frequency is readjusted. The resonance frequency is thus a function of the medium density. Based on this dependency, a density signal can be obtained, for example, by means of a microprocessor. A volumetric flow can also be determined by the mass flow and the density. In order to compensate computationally for temperature effects, the temperature at the measuring tube can be captured. This signal corresponds to the process temperature and is also available as an output signal.

Figure 1:
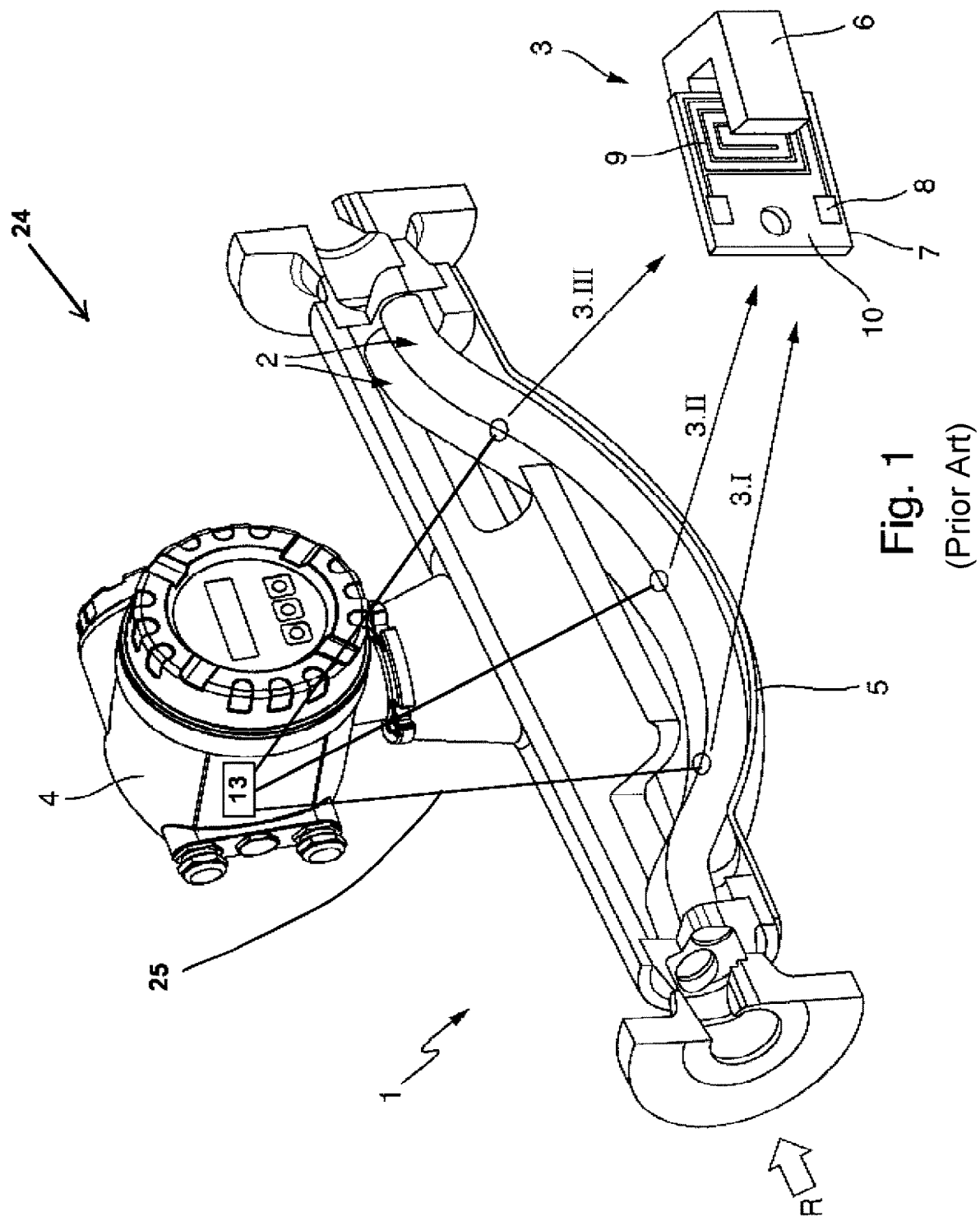
FIG. 1 shows a representation of a field device according to the prior art with an enlarged section of a vibration sensor/exciter.

A field device 24 according to the prior art is shown by way of example in FIG. 1 as a Coriolis measuring device. The measuring sensor 1 is shown as a two-tube variant in FIG. 1. In this case, a measuring medium is conducted through two measuring tubes 2 which run parallel to each other and are arranged in a sensor housing 5. The sensor housing 5 has an elongated structure and, at two terminal positions, comprises flanges for connection to a process line. In addition, the measuring device preferably has a measuring transducer 4 or a transmitter in which an evaluation unit is arranged. The aforementioned description of the measuring principle shows that a measuring tube 2 through which a measuring medium flows must first be vibrated by a vibration exciter 3.II. And finally, the vibration frequency and/or the vibration amplitude of a measuring tube 2 is detected by vibration sensors 3.I and 3.III. In the embodiment shown, a measuring and/or operating circuit 13 is located in the measuring transducer 4. This is electrically connected to the individual vibration exciters 3.II and/or vibration sensors 3.I and 3.III. In FIG. 1, the vibration exciter 3.II and vibration sensors 3.I and 3.III are designed identically as a vibration sensor/exciter unit and shown in an enlarged sectional view.

The measuring tubes 2 each have a bend, wherein the vibration exciter 3.II is arranged in the middle of the bend in relation to the longitudinal direction of the measuring tubes 2, and in each case a first vibration sensor 3.I for detecting the vibrations of the measuring tube 2 is arranged upstream of the vibration exciter 3.II in a flow direction R and a second vibration sensor 3.III for detecting the vibrations of the measuring tube 2 is arranged downstream of the vibration exciter 3.II in a flow direction R. This distance between the two vibration sensors 3.I and 3.III and the vibration exciter 3.II is preferably the same. However, Coriolis measuring devices are also known which comprise measuring tubes 2 without a corresponding bend.

The vibration exciter 3.II and the vibration sensors 3.I and 3.III are described in more detail below. The vibration exciter 3.II and/or the vibration sensors 3.I and 3.III have a magnetic apparatus 6 and a printed circuit board 10. The magnetic apparatus 6 may for example and preferably does comprise one or more permanent magnets. However, a solenoid may alternatively also be provided. These are arranged at a small distance from the printed circuit board 10, so that the magnetic field passes through the printed circuit board 10 at least in regions. At least one, but preferably a plurality of, conductor tracks 9 made of an electrically conductive material, for example of a metal, such as copper or platinum, is introduced into the printed circuit board 10 on a substrate material of the printed circuit board 10, wherein the conductor track can be understood as part of the printed circuit board. The substrate material is formed in particular from an electrical insulator, such as ceramic. For high-temperature applications, low-temperature co-fired ceramics (LTTC) are particularly preferred.

The magnetic field of the magnetic apparatus 6 can preferably be oriented in such a way that the field lines of the magnetic field run perpendicular to the board plane of the printed circuit board 10 at least in a region of the magnetic field.

The conductor track 9 is introduced helically onto or into the printed circuit board 10, at least in regions. The conductor track also has two contact-making elements 8 for tapping a measurement signal by means of a connection element (not shown here). A corresponding arrangement of a printed circuit board 10 with a conductor track 9 is usually referred to as a printed circuit board coil 7 or PCB coil. In the context of the present invention, the printed circuit board 7 and the magnetic apparatus 6 are defined as an arrangement 3 for generating tube vibrations and/or for tapping a measurement signal related to tube vibrations.

If a measurement signal due to tube vibration is to be tapped, such a measurement signal can be induced by relative movement of the printed circuit board 10 relative to the magnetic field of the magnetic device 6, in particular a voltage. If the arrangement 3 is to be used to excite tube vibration, a force, in particular a Lorentz force, will be generated by feeding-in an AC signal, for example at a resonance frequency of the measuring tubes 2 vibrating against one another, by the conductor track 9 in combination with the magnetic field of the magnetic apparatus 6.

In FIG. 1, only one conductor track 9 is visible; however, a plurality of conductor tracks 9 can also be stacked one above the other and be spaced apart by in each case one layer of the substrate material. In a preferred embodiment variant, the uppermost, i.e., actually exposed, conductor track 9 and/or the entire printed circuit board 10 is provided with a protective layer, e.g., a glass layer, which serves as protection against mechanical destruction of the uppermost conductor track 9. The printed circuit board 7 or the magnetic apparatus 6 is arranged on a first of the two measuring tubes 2. The complementary component of the arrangement 3, i.e., the magnetic device 6 respectively associated with the printed circuit board 7 or the printed circuit board 7 associated with the magnetic apparatus 6, can be arranged on the second of the two measuring tubes 2 or on a further element in or on the measuring sensor housing 5.

If the coil apparatuses are attached to a carrier body, the electrical connections can be routed along the carrier body. In this case, the arrangement of contact-making elements according to the invention makes electrical connections of the same length possible and an identical routing of the electrical connections.

Alternatively, the measuring sensor may, for example, have only one measuring tube, wherein a magnetic device of a respective vibration sensor is fastened, for example, to the measuring tube, and the associated coil apparatus on the carrier body or vice versa, or comprises even more than two measuring tubes. The person skilled in the art will set up the coil apparatuses according to his requirements. As shown here, the at least one measuring tube 2 can comprise at least one curve or can run straight. The applicability of the coil apparatus is independent of a measuring tube geometry.

Figure 2:
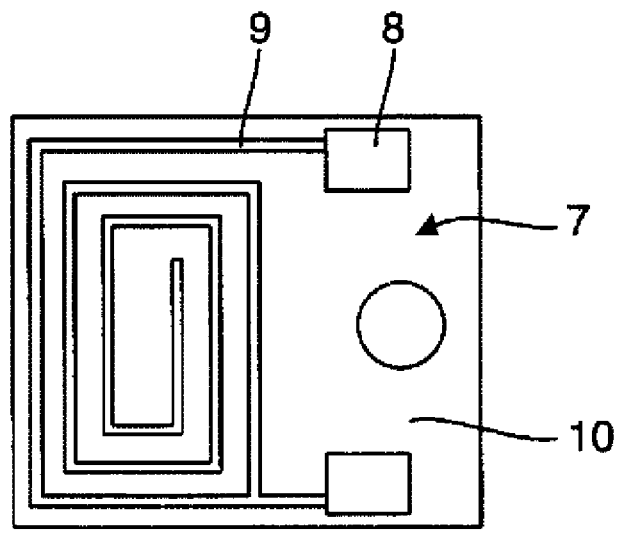
FIG. 2 shows a top view of a printed circuit board of a vibration sensor and/or vibration exciter according to the prior art.

In FIG. 2, the arrangement of the conductor track 9 on the printed circuit board 7 is shown again in detail by a top view. This form of the printed circuit board 7 and contact-making elements 8 is prior art and has the disadvantage that connection elements 22 which are welded to the contact-making elements 8 will already detach from the contact-making element 8 by the effect of the smallest rotational forces on the connection element.

Figure 3:
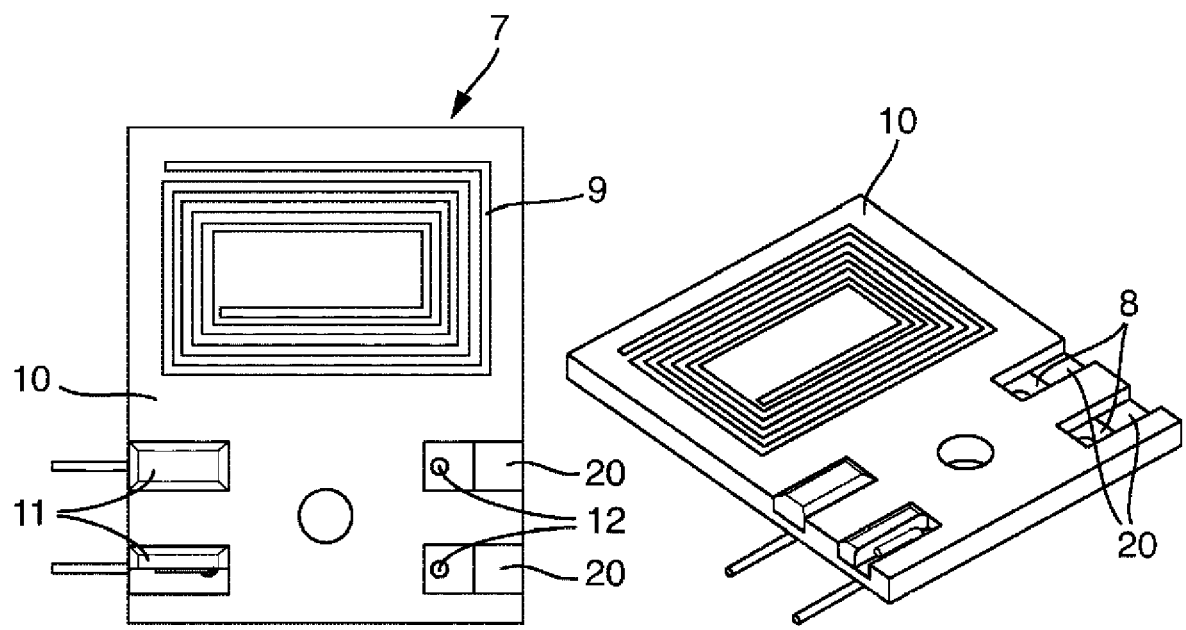
FIG. 3 shows a top view and an oblique view of a coil apparatus according to the present disclosure.

FIG. 3 shows a top view of an embodiment according to the invention of a printed circuit board coil 7 having a printed circuit board 10, which comprises a plurality of printed circuit board layers, each having a first side and a second side. A coil 9 having a first coil end and a second coil end (not visible) is applied to a first side in the form of an electrically conductive conductor track 9 as shown here. The circuit board coil 7 comprises four contact-making elements 8, wherein two contact-making elements 8 located on one side form a pair. The first pair of contact-making elements is connected to the first coil end by means of a first connection, and the second pair of contact-making elements is connected to the second coil end by means of a second connection. The contact-making elements 8 of a pair are each arranged on different sides of a sectional plane, a first side and a second side, so that electrical connections to the electronic measuring and/or operating circuit can be connected to the coil apparatus 7 on one side, that is to say either via the first side or via the second side. In this way, routing of the electrical connections can be securely set up so that line breaks and different cable lengths can be avoided.

Furthermore, FIG. 3 is an oblique view of an embodiment of a printed circuit board coil 7 according to the invention with indentations 20 in the printed circuit board 10 into which contact-making elements 8 are arranged. Two indentations 20 do not have sintered contacts 11. It can also be seen that the contact-making elements 8 of these two indentations 20 each have a hole 12, in particular a through-hole.

Figure 4:
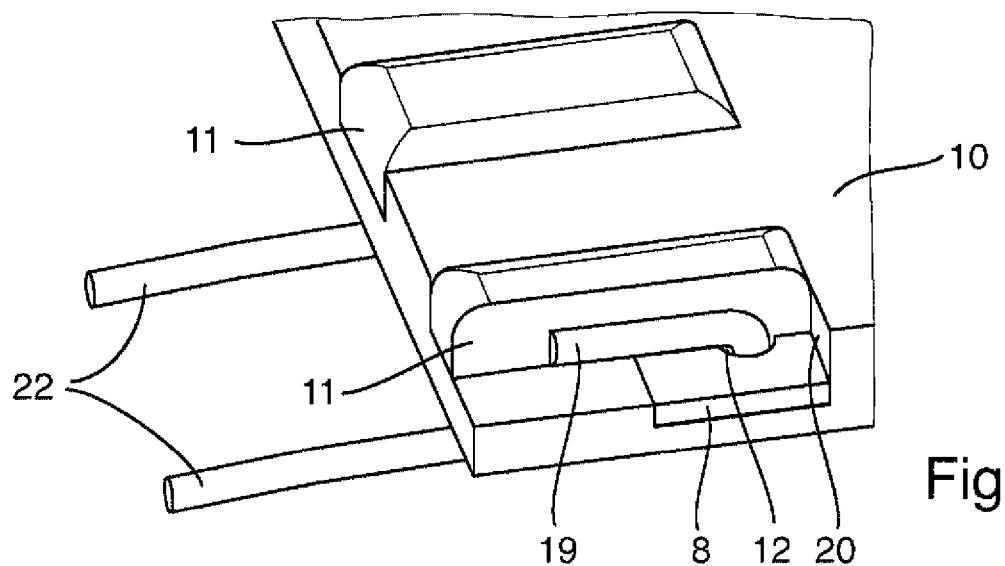
FIG. 4 shows a close-up of a contact-making element, a connection element and an indentation in a printed circuit board.

FIG. 4 is an enlarged view of the contact-making elements 8, the indentation 20, the sintered contacts 11 and the connection elements 22. In this case, a connection element 22 is hook-shaped and passes through the hole 12 in the contact-making element 8. The hole 12 is designed as a through-hole and passes through the printed circuit board 10 and the contact-making element 8. The electrical contact-making takes place via the sintered contact 11. Only half of a sintered contact is depicted, so that a part of the end of the connection element is visible. During sintering, a metal micro-particle mass is filled into the indentation 20 so that the end 19 or a part of the end 19 of the connection element 22 is enclosed and the surface of the contact-making element 8 is covered. Sintering forms the sintered contact 11 and thus also a firmly bonded connection. The enclosing of the end 19 prevents electrical contact with the contact-making element 8 from being lost by rotational forces acting on the connection element 22. Due to the hook shape of the connection element 22, the end 19 does not detach from the contact-making element 8 when tensile, shear, pressure, bending and/or rotational forces are acting.

Figure 5:
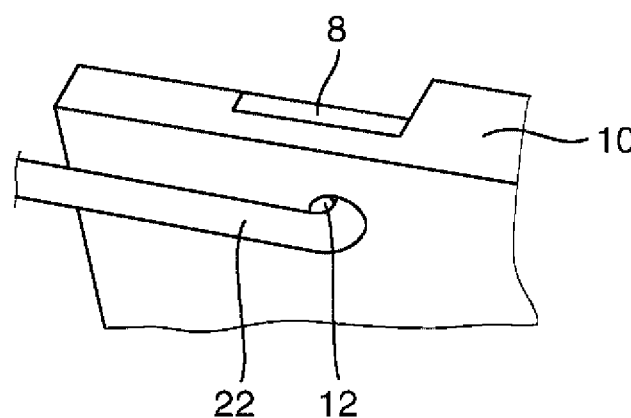
FIG. 5 shows a further close-up of the rear side of a contact-making device according to the present disclosure in a printed circuit board.

FIG. 5 is an oblique view of the rear side of an embodiment according to the invention. In this embodiment, the connection element 22 is guided through the hole 12 from the rear side of the printed circuit board 10. This is particularly advantageous since forces occurring during assembly processes will not act on the sintered contact or only in a reduced manner and the metal micro-particle mass is thus prevented from detaching.

Figure 6:
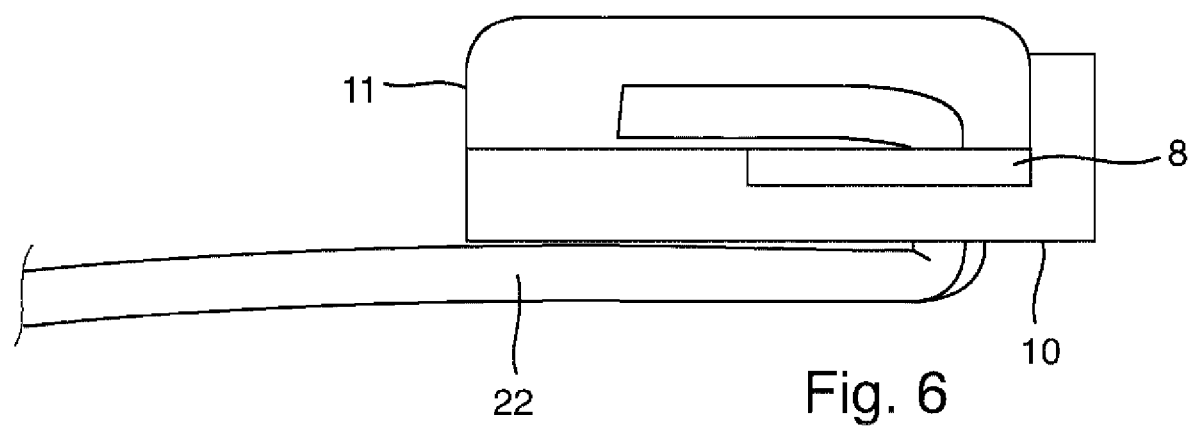
FIG. 6 shows an enlargement of a cross-sectional area of a coil apparatus according to the present disclosure, in particular of a contact-making element.

FIG. 6 is an enlarged view of a cross-section of an embodiment according to the invention. The connection element 22 is hook-shaped and can be divided into three parts. On the one hand, the first part, the end 19, which is enclosed by the metal micro-particle mass and is in electrical contact with the contact-making element 8. A second part, which is longer than the first part, leads to the measuring and/or operating circuit and thus forms an electrical connection. The third part lies between the first and second parts and is located in the hole in the printed circuit board. The parts are formed in each case at different positions by bending the connection element 22.

Figure 7:
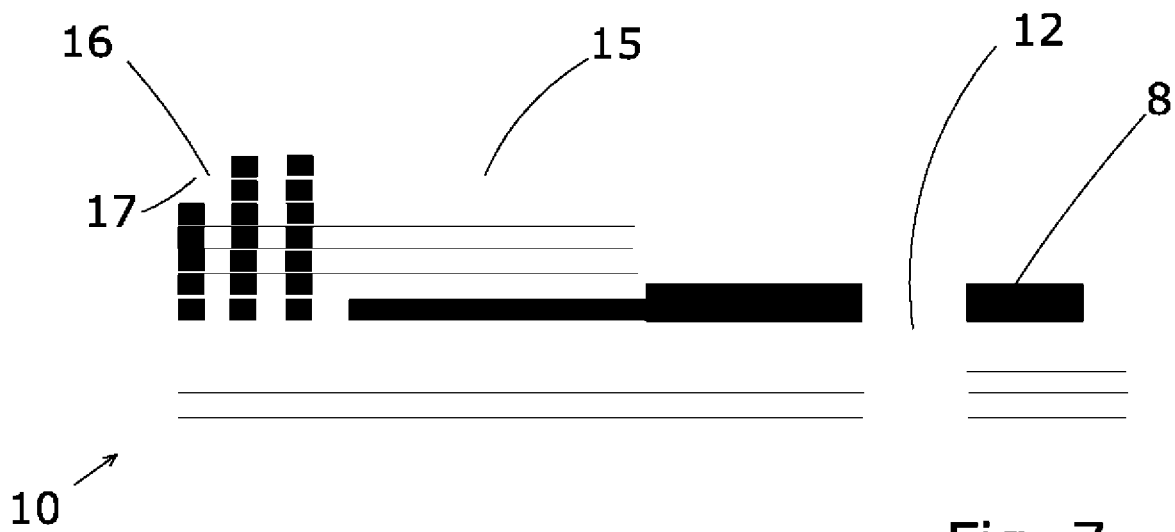
FIG. 7 shows a schematic cross-section of a printed circuit board consisting of a plurality of printed circuit board layers.

As shown in FIG. 7, a printed circuit board 10 may have a plurality of printed circuit board layers 15, wherein a plurality of printed circuit board layers 15 each have one coil. The coils of a plurality of printed circuit board layers are connected via through-contacts so that the coils of different printed circuit board layers 15 generate constructively interfering magnetic fields when an electrical voltage is applied between the through-contacts. For example, a first through-contact may connect first coil ends and a second through-contact connect second coil ends of different coils. This corresponds to a parallel connection of different coils. Alternatively, adjacent coils may be connected to one another via adjacent coil ends, wherein a first coil end of an outer coil is connected to the first connection, and wherein a second coil end of another outer coil is connected to the second connection, and wherein adjacent coil ends are connected by means of a through-contact. This would correspond to a series circuit of different coils. The contact-making elements 8 can be arranged in indentations 20, which, for example, is formed by notches in a contiguous group of printed circuit boards 15 as shown here in the side view. The contiguous group forming an indentation 20 may be different in the case of different contact-making elements 8. Not necessarily all contact-making elements 8 will be arranged on a printed circuit board 10. Instead of a notch, a printed circuit board can also have a smaller dimension than at least one adjacent printed circuit board, so that a contact-making element 8 is not covered by the printed circuit board layers 15 with smaller dimensions. According to the invention, the indentation 20 has a hole 12 that runs through the contact-making element 8 and the underlying printed circuit board layers 15. The hole 12 can be incorporated individually for each printed circuit board layer 15, after stacking the printed circuit board layers 15, or also after sintering the printed circuit board layers 15, in order to form the printed circuit board 10. The hole 12 can take the form of a blind hole or a through-hole. In this embodiment, the contact-making element 8 is a contact pad applied to the coil end and/or to the coil start of the circuit board coil. However, it can also comprise only the coil end and/or the coil start of the circuit board coil.

Figure 8:
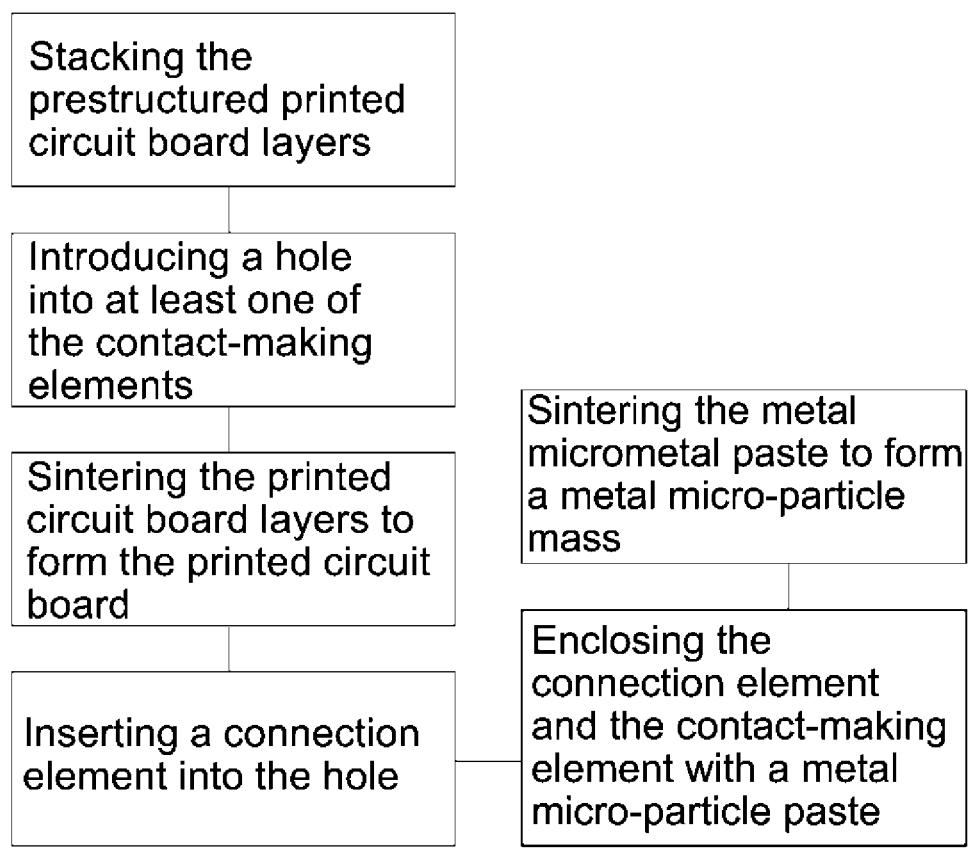
FIG. 8 shows an embodiment of a manufacturing method for a coil apparatus.

FIG. 8 shows a method chain for manufacturing a coil device according to the invention. In a first method step, prestructured printed circuit board layers provided with electrically conductive structures are stacked. It is particularly advantageous if holes are introduced into the intended positions in a second method step. This advantageously takes place by a punching process. After the holes have been introduced into the respective contact-making elements, the printed circuit board layers and the electrically conductive structures applied thereto are sintered. As a result, the organic components are burned out and the individual printed circuit board layers connect together to form a printed circuit board. In the third step, the connection elements are inserted into the respective holes. This is preferably done by inserting a connection wire on the rear side through the hole in the printed circuit board and bending the connection wire so that a hook-shaped structure forms. In the next step, one end of the electrical connection element in the indentation is enclosed by the metal micro-particle paste. This can be achieved by positioning the first end in the indentation and then at least partially filling with the metal micro-particle paste, or by at least partially filling the indentation with the metal micro-particle paste and then introducing the end of the electrical terminal through the hole into the indentation. In a final method step, the metal micro-particle paste is dried, wherein the drying process results in the metal micro-particle paste curing so that a metal micro-particle mass remains. Particles of the metal micro-particle paste preferably have a maximum extent of less than 50 micrometers, and in particular less than 35 micrometers and preferably less than 25 micrometers, since adhesion of the particles to each other and to unevennesses of the border is thus ensured for a tight fit of the metal micro-particle mass in the border. The drying process comprises heating the metal micro-particle paste 5 to a drying temperature of at least 150° C., and in particular at least 180° C., and preferably at least 210° C., in order to support good curing of the metal micro-particle paste. Furthermore, the drying process can comprise maintaining the drying temperature for at least 20 minutes, and in particular at least 10 minutes, and preferably at least 50 minutes, in order to support good curing of the metal micro-particle paste. In order to support uniform curing, a temperature adjustment from room temperature to drying temperature and/or from drying temperature to room temperature can comprise a period of time of at least 20 minutes, and in particular at least 35 minutes, and preferably at least 50 minutes. Drying and curing may also include sintering processes between different particles.

It may be advantageous to carry out the drying of the metal micro-particle paste in a high-pressure atmosphere of at least 3 bar, and preferably at least 5 bar, and particularly at least 10 bar, in this way sintering processes between individual particles of the metal micro-particle paste can be facilitated.

The invention claimed is:

1. A measuring sensor of a measuring device for detecting a mass flow rate, a viscosity, a density, and/or a variable derived therefrom of a medium flowing through at least one measuring tube of the measuring sensor, the measuring sensor comprising:
   the at least one measuring tube having an inlet and an outlet and configured to convey the medium between the inlet and outlet;
   at least one vibration exciter configured to excite the at least one measuring tube to vibrate; and
   at least two vibration sensors configured to detect the excursion of vibrations of the at least one measuring tube,
   wherein the at least one vibration exciter and also the at least two vibration sensors each includes a coil apparatus and a magnetic apparatus that are movable relative to one another and that are configured to interact with one another via a magnetic field,
   wherein each coil apparatus includes at least one coil and further includes a printed circuit board having at least one printed circuit board layer having a first side and a second side plane-parallel to the first side, wherein the at least one coil of each coil apparatus is formed by an electrically conductive conductor track arranged on the first side and/or the second side of the at least one printed circuit board layer, wherein the printed circuit board of each coil apparatus includes at least two indentations with a bottom and further includes at least two contact-making elements, wherein each contact-making element is arranged in the bottom of a respective indentation, wherein each contact-making element connects the at least one coil to an electronic measuring and/or operating circuit of the measuring device via a connection element arranged in the respective indentation, wherein each of the at least two contact-making element has a hole, and wherein each indentation is at least partially filled with a solid metal micro-particle mass that connects the connection element in a firmly bonded manner to the printed circuit board and to the contact-making element and that mediates an electrical contact between the connection element and the contact-making element.

2. The measuring sensor according to claim 1, wherein each connection element is passed through the hole of the respective contact-making element so that the connection element is connected to the circuit board at least on one side in a positive-locking manner.

3. The measuring sensor according to claim 2, wherein one end of each connection element is curved, bent or hook-shaped at least in portions
and is conducted through or at least inserted into the hole of the respective contact-making element.

4. The measuring sensor according to claim 1, wherein each connection element includes a connection wire embodied of at least one metal from the following list: silver, gold, copper, platinum, tantalum, and palladium.

5. The measuring sensor according to claim 1, wherein each metal micro-particle mass includes microparticles of at least one metal from the following list: silver, gold, copper, platinum, tantalum, and palladium.

6. The measuring sensor according to claim 1, wherein each hole takes the form of a through-hole and passes through the contact-making element and the printed circuit board.

7. A method for producing a coil apparatus, wherein the coil apparatus includes at least one coil and a printed circuit board having at least one printed circuit board layer having a first side and a second side plane-parallel to the first side, wherein the printed circuit board includes at least two indentations with a bottom and further includes at least two contact-making elements, wherein each contact-making element is arranged in the bottom of a respective indentation, wherein each contact-making element connects the at least one coil to an electronic measuring and/or operating circuit of a measuring instrument via a connection element arranged in the respective indentation, and wherein the at least one coil is formed by an electrically conductive conductor track on the first side and/or the second side of the at least one printed circuit board layer, the method comprising:

introducing a through-hole into each of the contact-making elements and also the circuit board;

inserting a connection element into each respective through-hole;

partially filling each indentation with a metal micro-particle paste, thereby enclosing each connection element and its respective contact-making element with the metal micro-particle paste; and drying, curing, and/or sintering the metal micro-particle paste to form a metal micro-particle mass.

8. The method according to claim 7, wherein the drying includes heating the metal micro-particle paste to a drying temperature of at least 150° C.

9. The method according to claim 8, the drying includes maintaining the drying temperature for at least 20 minutes.

10. The method according to claim 8, wherein a temperature adjustment from room temperature to the drying temperature and/or from the drying temperature to room temperature includes a time period of at least 20 minutes.

11. The method according to claim 7, wherein particles of the metal micro-particle paste have a maximum extent of less than 50 micrometers.

12. The method according to claim 7, wherein the hole is formed by a punching method or a laser method.

13. The method according to claim 7, wherein pre-structured printed circuit board layers are stacked and sintered to form the printed circuit board, and wherein the hole is introduced into the contact-making element before or after sintering.

14. A field device of process measurement technology, comprising:

a measuring sensor of a measuring device for detecting a mass flow rate, a viscosity, a density, and/or a variable derived therefrom of a medium flowing through at least one measuring tube of the measuring sensor, the measuring sensor comprising:

the at least one measuring tube having an inlet and an outlet and configured to convey the medium between the inlet and outlet;

at least one vibration exciter configured to excite the at least one measuring tube to vibrate; and at least two vibration sensors configured to detect the excursion of vibrations of the at least one measuring tube, wherein the at least one vibration exciter and also the at least two vibration sensors each includes a coil apparatus and a magnetic apparatus that are movable relative to one another and that are configured to interact with one another via a magnetic field, wherein each coil apparatus includes at least one coil and further includes a printed circuit board having at least one printed circuit board layer having a first side and a second side plane-parallel to the first side, wherein the at least one coil of each coil apparatus is formed by an electrically conductive conductor track arranged on the first side and/or the second side of the at least one printed circuit board layer, wherein the printed circuit board of each coil apparatus includes at least two indentations with a bottom and further includes at least two contact-making elements, wherein each contact-making element is arranged in the bottom of a respective indentation, wherein each contact-making element connects the at least one coil to an electronic measuring and/or operating circuit of the measuring device via a connection element arranged in the respective indentation, wherein each of the at least two contact-making element has a hole, and wherein each indentation is at least partially filled with a solid metal micro-particle mass that connects the connection element in a firmly bonded manner to the printed circuit board and to the contact-making element and that mediates an electrical contact between the connection element and the contact-making element; and an electronic measuring and/or operating circuit, wherein the electronic measuring and/or operating circuit is configured to operate the at least two vibration sensors and the at least one vibration exciter and is connected thereto by means of electrical connections, and wherein the electronic measuring/operating circuit is further designed to determine and provide mass flow rate readings and/or density readings.

\* \* \* \* \*